United States Patent
Sanada et al.

(10) Patent No.: US 12,269,945 B2
(45) Date of Patent: Apr. 8, 2025

(54) FLUX RESIN COMPOSITION, ELECTRONIC COMPONENT, METHOD FOR MANUFACTURING THE ELECTRONIC COMPONENT, MOUNTING STRUCTURE, AND METHOD FOR MANUFACTURING THE MOUNTING STRUCTURE

(71) Applicant: Panasonic Intellectual Property Management Co., Ltd., Osaka (JP)

(72) Inventors: Shohei Sanada, Hyogo (JP); Shigeru Yamatsu, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 363 days.

(21) Appl. No.: 17/551,758

(22) Filed: Dec. 15, 2021

(65) Prior Publication Data

US 2022/0195177 A1 Jun. 23, 2022

(30) Foreign Application Priority Data

Dec. 17, 2020 (JP) .................................. 2020-209678

(51) Int. Cl.
C08L 63/04 (2006.01)
H05K 1/18 (2006.01)
H05K 3/34 (2006.01)

(52) U.S. Cl.
CPC .............. *C08L 63/04* (2013.01); *H05K 1/181* (2013.01); *H05K 3/3457* (2013.01); *C08L 2203/20* (2013.01); *C08L 2205/025* (2013.01); *C08L 2205/03* (2013.01)

(58) Field of Classification Search
CPC ................. C08L 63/04; C08L 2203/20; C08L 2205/025; C08L 2205/03; H05K 1/181; H05K 3/3457
See application file for complete search history.

(56) References Cited

U.S. PATENT DOCUMENTS

| | | | |
|---|---|---|---|
| 2017/0190005 A1 | 7/2017 | Uehata et al. | |
| 2020/0306893 A1* | 10/2020 | Suzuki | B23K 35/3613 |
| 2021/0245306 A1 | 8/2021 | Kajikawa et al. | |
| 2022/0049085 A1* | 2/2022 | Yamatsu | C08G 59/245 |
| 2023/0141042 A1* | 5/2023 | Sanada | H05K 1/181 |
| | | | 361/760 |

FOREIGN PATENT DOCUMENTS

| | | | | |
|---|---|---|---|---|
| JP | 2018053056 A | * | 4/2018 | |
| JP | 2020-025973 A | | 2/2020 | |
| WO | 2015/146473 A1 | | 10/2015 | |
| WO | WO-2020116313 A1 | * | 6/2020 | ........... C08G 59/245 |

* cited by examiner

*Primary Examiner* — Nathan Milakovich
(74) *Attorney, Agent, or Firm* — GREENBLUM & BERNSTEIN, P.L.C.

(57) ABSTRACT

A flux resin composition contains: 60-80% by weight of an epoxy resin; 0.01-2% by weight of an imidazole compound; 1-5% by weight of a thixo agent; 4-20% by weight of an activator; and 7-30% by weight of a phenolic compound. The epoxy resin contains at least one resin selected from the group consisting of naphthalene type epoxy resins, biphenyl aralkyl type epoxy resins, trisphenol methane type epoxy resins, biphenyl type epoxy resins, and dicyclopentadiene type epoxy resins. Content of the at least one resin falls within a range from 15% by weight to 40% by weight with respect to a total weight of the flux resin composition. The phenolic resin is liquid and contains a phenol novolac.

19 Claims, 5 Drawing Sheets

FLUX RESIN COMPOSITION, ELECTRONIC COMPONENT, METHOD FOR MANUFACTURING THE ELECTRONIC COMPONENT, MOUNTING STRUCTURE, AND METHOD FOR MANUFACTURING THE MOUNTING STRUCTURE

CROSS-REFERENCE TO RELATED APPLICATIONS

The present application is based upon, and claims the benefit of priority to, Japanese Patent Application No. 2020-209678, filed on Dec. 17, 2020, the entire contents of which are hereby incorporated by reference.

TECHNICAL FIELD

The present disclosure generally relates to a flux resin composition, an electronic component, a method for manufacturing the electronic component, a mounting structure, and a method for manufacturing the mounting structure. More particularly, the present disclosure relates to a flux resin composition, an electronic component including a cured product of the flux resin composition and a method for manufacturing such an electronic component, and a mounting structure including a cured product of the flux resin composition and a method for manufacturing such a mounting structure.

BACKGROUND ART

A flux for use in soldering has the effect of chemically removing a metal oxide present on respective metallic surfaces of a solder alloy and an object to be soldered and thereby enabling a metallic element to move through the boundary between the solder alloy and the object to be soldered. Thus, performing soldering using the flux allows an intermetallic compound to be formed between the respective metallic surfaces of the solder alloy and the object to be soldered, thereby achieving a high bond strength between them. In general, a flux for use in soldering includes some components that are not decomposed or vaporized during a reflow process. Therefore, such components will be left as flux residues around the soldered portion after the soldering process.

In recent years, as the performance of automobiles has been further enhanced, onboard electronic devices have been built in such high-performance automobiles in increasing numbers and in a broader variety of locations. Under the circumstances such as these, the environment to which the onboard electronic devices are exposed has become increasingly severe. As a result, depending on their installation locations, those electronic devices are sometimes exposed to a heat cycle of 40° C.-85° C. under their operating environment.

Meanwhile, extensive effort has recently been made to further reduce the size, and further enhance the performance, of those onboard devices, thus making soldering portions even narrower and smaller. That is to say, the parts themselves to be soldered together have been downsized so much that it has become increasingly difficult to ensure reliability for the heat cycle to be performed on the soldering portions.

To overcome such a problem, a method has been proposed to ensure sufficient reliability by reinforcing the soldering portions by covering the soldering portions with an underfilling material or a resin molding material. Such a method, however, requires cleaning up the flux residues before the reinforcement, which is sometimes a time- and cost-consuming job.

Thus, to eliminate the need for such cleaning, a method has been proposed to use the flux residues themselves as reinforcement by adding a thermosetting resin to the flux.

WO 2015/146473 A1 discloses a flux with the ability to not only reinforce the soldering portions but also eliminate the need for cleaning as well by adding a bisphenol A type epoxy resin as a thermosetting resin and allowing the bisphenol A type resin to cure after the soldering process.

JP 2020-25973 A discloses a flux composition containing 20 wt % to 50 wt % of an epoxy resin, 15 wt % to 45 wt % of diallyl bisphenol A, and 1 wt % to 30 wt % of an organic acid.

There have been increasing demands for such flux compositions that may be used to make a reinforcing material with sufficient reinforcement effects.

SUMMARY

The present disclosure provides a flux resin composition that allows its cured product as a flux residue to produce sufficient reinforcement effects while still serving as a flux.

The present disclosure also provides an electronic component that uses such a flux resin composition, a method for manufacturing such an electronic component, a mounting structure, and a method for manufacturing such a mounting structure.

A flux resin composition according to an aspect of the present disclosure contains: 60% by weight to 80% by weight of an epoxy resin; 0.01% by weight to 2% by weight of an imidazole compound; 1% by weight to 5% by weight of a thixo agent; 4% by weight to 20% by weight of an activator; and 7% by weight to 30% by weight of a phenolic compound. The epoxy resin contains at least one resin selected from the group consisting of naphthalene type epoxy resins, biphenyl aralkyl type epoxy resins, trisphenol methane type epoxy resins, biphenyl type epoxy resins, and dicyclopentadiene type epoxy resins. Content of the at least one resin falls within a range from 15% by weight to 40% by weight with respect to a total weight of the flux resin composition. The phenolic resin is liquid and contains a phenol novolac.

An electronic component according to another aspect of the present disclosure includes an electronic component body, a conductor, a solder bump, and a reinforcing portion. The conductor is formed on a surface of the electronic component body. The solder bump is disposed on the conductor. The solder bump is electrically connected to the conductor. The reinforcing portion is a cured product of the flux resin composition. The reinforcing portion covers a joint between the conductor and the solder bump.

A method for manufacturing an electronic component according to still another aspect of the present disclosure is a method for manufacturing the electronic component described above. The method includes curing the flux resin composition after applying the flux resin composition onto the joint between the conductor and the solder bump.

A mounting structure according to yet another aspect of the present disclosure includes a circuit board, an electronic component, a solder bump, and a reinforcing portion. The circuit board includes a first conductor. The electronic component includes a second conductor. The solder bump is interposed between the first conductor and the second conductor. The solder bump electrically connects the first conductor and the second conductor to each other. The reinforcing portion is a cured product of the flux resin composition. The reinforcing portion reinforces at least one of a joint between the first conductor and the solder bump or a joint between the second conductor and the solder bump.

A method for manufacturing a mounting structure according to yet another aspect of the present disclosure is a method for manufacturing the mounting structure described above. The method includes curing the flux resin composition after applying the flux resin composition onto at least one of the joint between the first conductor and the solder bump or the joint between the second conductor and the solder bump.

BRIEF DESCRIPTION OF DRAWINGS

The figures depict one or more implementations in accordance with the present teaching, by way of example only, not by way of limitations. In the figures, like reference numerals refer to the same or similar elements.

DETAILED DESCRIPTION

1. Overview

Figure 1:
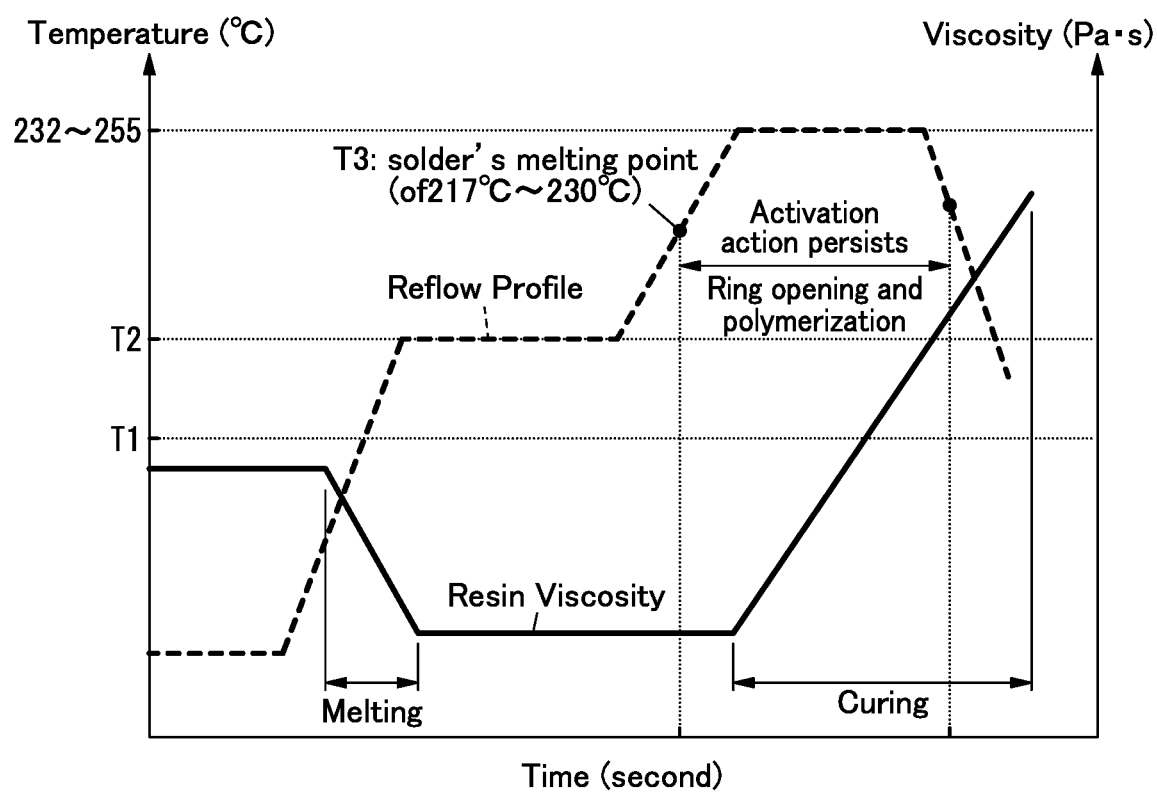
FIG. 1 is a graph showing an exemplary reflow profile when a flux resin composition according to an exemplary embodiment of the present disclosure and solder are heated.

A flux resin composition (X) according to an exemplary embodiment contains an epoxy resin (A), an imidazole compound (B), a thixo agent (C), an activator (D), and a phenolic compound (E). The flux resin composition (X) contains 60% by weight to 80% by weight of the epoxy resin (A). The flux resin composition (X) contains 0.01% by weight to 2% by weight of the imidazole compound (B). The flux resin composition (X) contains 1% by weight to 5% by weight of the thixo agent (C). The flux resin composition (X) contains 4% by weight to 20% by weight of the activator (D). The flux resin composition (X) contains 7% by weight to 30% by weight of the phenolic compound (E).

The epoxy resin (A) contains at least one resin selected from the group consisting of naphthalene type epoxy resins, biphenyl aralkyl type epoxy resins, trisphenol methane type epoxy resins, biphenyl type epoxy resins, and dicyclopentadiene type epoxy resins. The content of the at least one resin falls within the range from 15% by weight to 40% by weight with respect to the total weight of the flux resin composition (X).

The phenolic resin (E) is liquid and contains a phenol novolac.

The flux resin composition (X) according to this exemplary embodiment contains a liquid phenol novolac, and therefore, allows a cured product (reinforcing portion) thereof to achieve a higher coverage rate, thus enabling the cured product that is a flux residue to produce sufficient reinforcement effects. Specifically, in the flux resin composition (X) according to this exemplary embodiment, the cured product thereof comes to have an increased height and be adhered to the bump in an increased area, thus covering the bump at a higher ratio (i.e., achieving a higher coverage rate) compared to a flux resin composition containing no liquid phenol novolac. This makes it easier for the cured product to reinforce the bump. In addition, in the flux resin composition (X) according to this exemplary embodiment, the cured product thereof has so high a glass transition temperature that the reinforcing portion achieves a high degree of reliability and good storage stability, thus achieving high productivity as well.

As used herein, the "flux residue" refers to a cured product that has been left and cured after the flux resin composition (X) has served as a flux.

2. Details

Next, a flux resin composition (X), an electronic component 100 (see FIG. 2), a method for manufacturing the electronic component 100 (see FIGS. 3A-3C), a mounting structure 1 (see FIGS. 4A-4C), and a method for manufacturing the mounting structure 1 (see FIGS. 5A-5C) according to this embodiment will be described in detail.

2-1. Flux Resin Composition (X)

The flux resin composition (X) according to this embodiment contains, as described above, an epoxy resin (A), an imidazole compound (B), a thixo agent (C), an activator (D), and a phenolic compound (E). These constituent components, namely, the epoxy resin (A), the imidazole compound (B), the thixo agent (C), the activator (D), and the phenolic compound (E) will be described in detail one by one below.

(1) Epoxy Resin (A)

The epoxy resin (A) is a compound having an epoxy group and has the property of being cured by heating. Therefore, the epoxy resin (A) may impart a thermosetting property to the flux resin composition (X). The epoxy resin (A) preferably has two or more epoxy groups in one molecule. This allows such an epoxy resin (A) to be cured more easily than an epoxy resin having only one epoxy group in one molecule.

The epoxy resin (A) is preferably liquid at a normal temperature. If the epoxy resin (A) is liquid at a normal temperature, then the epoxy resin (A) and the other components may be mixed more easily in the flux resin composition (X). Being liquid at a normal temperature means having fluidity under the atmospheric pressure and at an ambient temperature within the range from 5° C. to 28° C. (particularly around 20° C.). In order for the epoxy resin (A) to be liquid at the normal temperature, the epoxy resin (A) may include only components that are in liquid state at the normal temperature. Alternatively, the epoxy resin (A) may include a component that is in liquid state at the normal temperature and a component that is not in liquid state at the normal temperature. Still alternatively, the epoxy resin (A) may be in liquid state at the normal temperature due to the presence of, for example, a reactive diluent or a solvent.

The epoxy resin (A) includes two types of epoxy resins, namely, an epoxy resin (A1) and an epoxy resin (A2) other than the epoxy resin (A1).

The epoxy resin (A1) has a higher degree of rigidity than the epoxy resin (A2) and includes at least one resin selected from the group consisting of naphthalene type epoxy resins, biphenyl aralkyl type epoxy resins, trisphenol methane type epoxy resins, biphenyl type epoxy resins, and dicyclopentadiene type epoxy resins. This makes it easier to increase the glass transition temperature (Tg) of the flux resin composition (X) that has been cured.

Each of the naphthalene type epoxy resins, biphenyl aralkyl type epoxy resins, trisphenol methane type epoxy resins, biphenyl type epoxy resins, and dicyclopentadiene type epoxy resins has two or more cyclic structures in one molecule, and therefore, increases the chances of increasing the glass transition temperature (Tg) of the cured product, compared to an epoxy resin that does not have two or more cyclic structures in one molecule. This is probably because the presence of the cyclic structures restricts the movement of a molecular chain. Specifically, each of the naphthalene type epoxy resins, biphenyl aralkyl type epoxy resins, trisphenol methane type epoxy resins, biphenyl type epoxy resins, and dicyclopentadiene type epoxy resins is likely to turn into a cured product having a glass transition temperature equal to or higher than 85° C.

The naphthalene type epoxy resin is an epoxy resin having one or more naphthalene skeletons in one molecule. The naphthalene skeletons with rigidity and hydrophobicity may increase the glass transition temperature of the cured product of the flux resin composition (X).

The biphenyl aralkyl type epoxy resin is an epoxy resin having one or more aralkyl skeletons, each having a biphenyl group, in one molecule. The biphenyl aralkyl type epoxy resin has a rigid biphenyl group in its aralkyl skeleton(s), thus increasing the glass transition temperature of the cured product of the flux resin composition (X).

The trisphenol methane type epoxy resin is an epoxy resin with three epoxy groups, each having a phenyl methane skeleton, in one molecule, and has so high a functional group (epoxy group) density as to increase the glass transition temperature of the cured product of the flux resin composition (X).

The dicyclopentadiene type epoxy resin is an epoxy resin having one or more dicyclopentadiene skeletons in one molecule. The dicyclopentadiene type epoxy resin has a rigid dicyclopentadiene skeleton, thus increasing the glass transition temperature of the cured product of the flux resin composition (X).

The epoxy resin (A1) preferably has an epoxy group equivalent falling within the range from 100 to 500.

Examples of the epoxy resin (A1) include: a naphthalene type epoxy resin expressed by the following Formula (1) (such as HP-4302D (manufactured by DIC Corporation; semi-solid state)); a naphthalene type epoxy resin expressed by the following Formula (2) (such as HP-4700 (manufactured by DIC Corporation and having a softening point of 85° C. to 95° C.) and HP-4710 (manufactured by DIC Corporation and having a softening point of 85° C. to 105° C.)); a naphthalene type epoxy resin expressed by the following Formula (3) (such as EXA-4750 (manufactured by DIC Corporation and having a softening point of 80° C.)); a naphthalene type epoxy resin expressed by the following Formula (4) (such as HP-4770 (manufactured by DIC Corporation and having a softening point of 67° C. to 77° C.)); and a mixture of a naphthalene type epoxy resin expressed by the following Formula (5) (such as HP-6000 (manufactured by DIC Corporation and having a softening point of 65° C. to 85° C.) and a naphthalene type epoxy resin expressed by the following Formula (6) (such as HP-6000L (manufactured by DIC Corporation and having a softening point of 59° C.)).

Examples of the epoxy resin (A1) further include: a trisphenol methane type epoxy resin expressed by the following Formula (7) (such as HP-7241 (manufactured by DIC Corporation and having a softening point of 66° C.)); a trisphenol methane type epoxy resin expressed by the following Formula (8) (such as HP-7250 (manufactured by DIC Corporation and having a semi-solid state)); and a trisphenol methane type epoxy resin expressed by the following Formula (9) (such as EPPN-501H (manufactured by Nippon Kayaku Co., Ltd. and having a softening point of 51° C. to 57° C.), EPPN-501HY (manufactured by Nippon Kayaku Co., Ltd. and having a softening point of 57° C. to 63° C.), and EPPN-502H (manufactured by Nippon Kayaku Co., Ltd. and having a softening point of 60° C. to 72° C.)).

Examples of the epoxy resin (A1) further include a biphenyl aralkyl type epoxy resin expressed by the following Formula (10) (such as NC-3000 (manufactured by Nippon Kayaku Co., Ltd. and having a softening point of 53° C. to 63° C.), NC-3000L (manufactured by Nippon Kayaku Co., Ltd. and having a softening point of 45° C. to 60° C.), NC-3000-H (manufactured by Nippon Kayaku Co., Ltd. and having a softening point of 65° C. to 75° C.), and NC-3100 (manufactured by Nippon Kayaku Co., Ltd. and having a softening point of 90° C. to 103° C.)).

Examples of the epoxy resin (A1) further include a biphenyl type epoxy resin expressed by the following Formula (11) (such as YH4000 (manufactured by Mitsubishi Chemical Corporation and having a softening point of 105° C.) and YX4000H (manufactured by Mitsubishi Chemical Corporation and having a softening point of 105° C.)).

Examples of the epoxy resin (A1) further include a dicyclopentadiene type epoxy resin expressed by the following Formula (12) (such as HP-7200 (manufactured by DIC Corporation and having a softening point of 56° C. to 66° C.), HP-7200L (manufactured by DIC Corporation and having a softening point of 50° C. to 60° C.), HP-7200H (manufactured by DIC Corporation and having a softening point of 78° C. to 88° C.), HP-7200HH (manufactured by DIC Corporation and having a softening point of 88° C. to 98° C.), HP-7200HHH (manufactured by DIC Corporation and having a softening point of 100° C. to 110° C.), and XD-1000 (manufactured by Nippon Kayaku Co., Ltd. and having a softening point of 68° C. to 78° C.)).

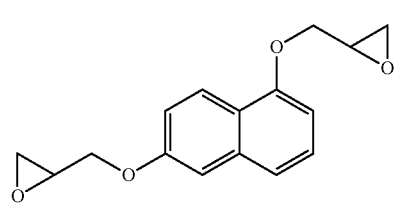

(1)

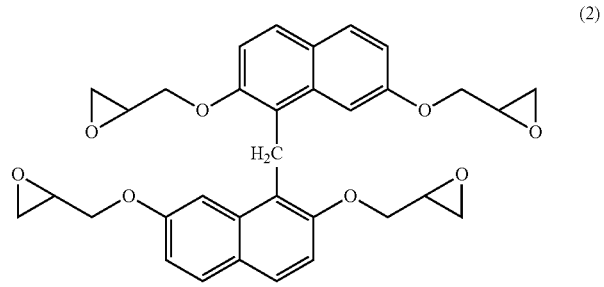

(2)

-continued
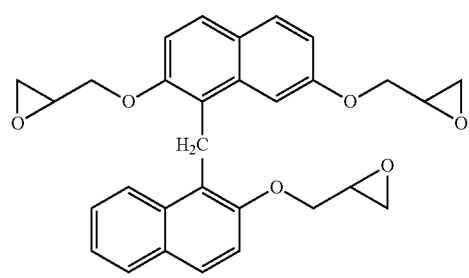
(3)
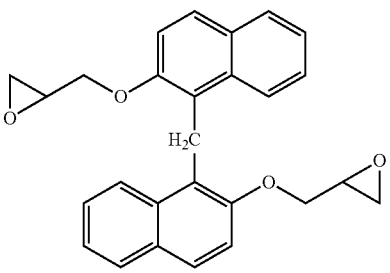
(4)
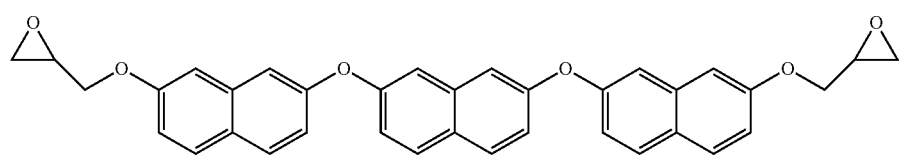
(5)
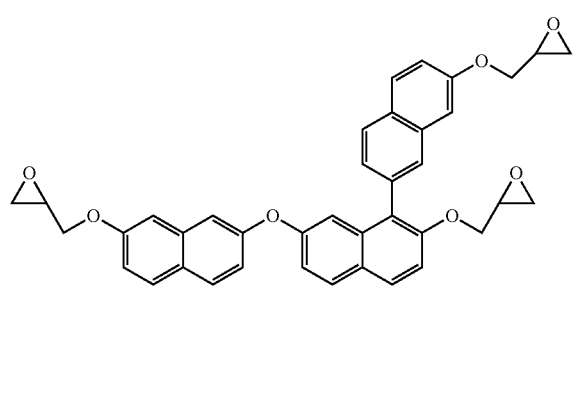
(6)
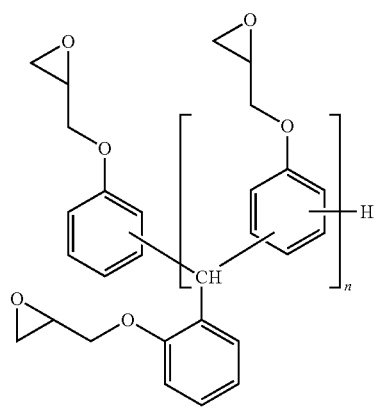
(7)
where n indicates an integer falling within the range from 1 to 10.
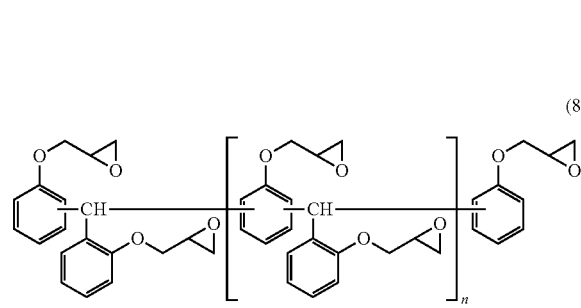
(8)
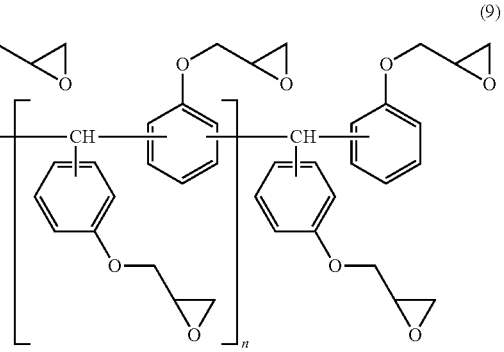
(9)
where n indicates an integer falling within the range from 1 to 10.
where n indicates an integer falling within the range from 1 to 10.

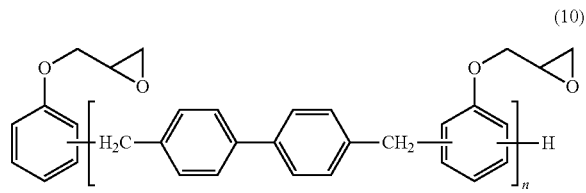

(10)

where n indicates an integer falling within the range from 1 to 10.

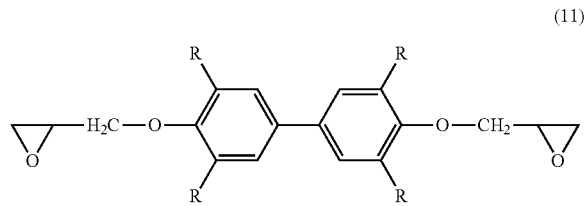

(11)

where R indicates a methyl group.

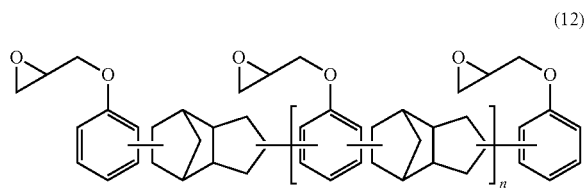

(12)

where n indicates an integer falling within the range from 1 to 10.

The epoxy resin (A2) has lower rigidity than the epoxy resin (A1). The epoxy resin (A2) may include one or more components selected from the group consisting of: glycidyl ether type epoxy resins; glycidyl amine type epoxy resins; glycidyl ester type epoxy resins; olefin oxidation type (alicyclic) epoxy resins; bisphenol type epoxy resins such as bisphenol A type epoxy resins and bisphenol F type epoxy resins; hydrogenated bisphenol type epoxy resins such as hydrogenated bisphenol A type epoxy resins and hydrogenated bisphenol F type epoxy resins; alicyclic epoxy resins; phenol-novolac type epoxy resins; cresol-novolac type epoxy resins; aliphatic epoxy resins; and triglycidyl isocyanurate.

The epoxy resin (A2) particularly preferably includes any one of a bisphenol A type epoxy resin, a bisphenol F type epoxy resin, a hydrogenated bisphenol A type epoxy resin, or a hydrogenated bisphenol F type epoxy resin. This makes it easier to lower the viscosity of the flux resin composition (X) and thereby improve the physical properties of the cured product of the flux resin composition (X).

(2) Imidazole Compound (B)

The imidazole compound (B) is a curing agent of the epoxy resin (A). The flux resin composition (X) needs to be cured after having served as a flux during the reflow process. In this embodiment, the imidazole compound (B) has so high a melting point that it is difficult for the imidazole compound (B) to serve as a curing agent in a temperature range from room temperature to the melting point of the solder bump, thus retarding the curing reaction of the epoxy resin. This allows the flux resin composition (X) to serve as a flux in the meantime. After that, as the temperature is further increased to a temperature higher than the melting point of the solder bump, the imidazole compound (B) will start to serve as a curing agent after soldering has been done. Thus, the ring-opening polymerization proceeds between the epoxy resin (A) and the imidazole compound (B), thus causing the flux resin composition (X) to be cured. Then, after having been cured, the flux resin composition (X) will serve as a reinforcing portion 4.

The imidazole compound (B) is preferably solid having a melting point of 130° C. or more. In that case, at a temperature lower than 130° C. (e.g., at 25° C.), the imidazole compound (B) is not melted easily but remains solid, and therefore, mixes with the epoxy resin (A) less easily, compared to a situation where the imidazole compound (B) is liquid. This may reduce the reaction between the epoxy resin (A) and the imidazole compound (B), thus improving the storage stability of the flux resin composition (X).

The imidazole compound (B) may be one or more imidazole compounds selected from the group consisting of, for example: 2-methyl imidazole (product number 2MZ-H manufactured by Shikoku Chemicals Corporation and having a melting point of 140-148° C.); 2-phenyl imidazole (product numbers 2PZ, 2PZ-PW manufactured by Shikoku Chemicals Corporation and having a melting point of 137-147° C.); 2-phenyl-4-methyl imidazole (product number 2P4MZ manufactured by Shikoku Chemicals Corporation and having a melting point of 174-184° C.); 2,4-diamino-6-[2'-methylimidazolyl-(1')]-ethyl-s-triazine (product numbers 2MZ-A, 2MZA-PW manufactured by Shikoku Chemicals Corporation and having a melting point of 248-268° C.); 2,4-diamino-6-[2'-undecylimidazolyl-(1')]-ethyl-s-triazine (product number C11Z-A manufactured by Shikoku Chemicals Corporation and having a melting point of 187-195° C.); 2,4-diamino-6-[2'-ethyl-4'-methylimidazolyl-(1')]-ethyl-s-triazine (product number 2E4MZ-A manufactured by Shikoku Chemicals Corporation and having a melting point of 215-225° C.); an isocyanurate adduct of 2,4-diamino-6-[2'-methylimidazolyl-(1')]-ethyl-s-triazine (product numbers 2MA-OK, 2MAOK-PW manufactured by Shikoku Chemicals Corporation and having a melting point of 260° C.); an isocyanurate adduct of 2-phenyl imidazole (product number 2PZ-OK manufactured by Shikoku Chemicals Corporation and having a melting point of 140° C.); 2-phenyl-4,5-dihydroxymethyl imidazole (product number 2PHZ-PW manufactured by Shikoku Chemicals Corporation and having a melting point of 230° C.); and 2-phenyl-4-methyl-5-hydroxymethyl imidazole (product number 2P4MHZ-PW manufactured by Shikoku Chemicals Corporation and having a melting point of 191-195° C.).

The form of the solid imidazole compound (B) may be, but does not have to be, powder, granule, or particle, for example. This makes it easier to not only reduce the reaction of the flux resin composition (X) at room temperature but also rapidly cure the flux resin composition (X) at the time of the reflow process. If the imidazole compound (B) is in the form of powder, for example, its mean particle size preferably falls, but does not have to fall, within the range from 0.5 μm to 50 μm. Note that as the mean particle size, a median diameter (D50) of a particle size distribution obtained by laser diffraction/scattering method may be adopted, for example.

(3) Thixo Agent (C)

The thixo agent (C) is a compound that imparts a thixo property to the flux resin composition (X). As used herein, the "thixo property" refers to a property that causes the substance to have a decreased viscosity when subjected to a shear stress. The thixo property is quantified by a thixo ratio and may be obtained by, for example, measuring, using a rotational viscometer, two viscosities with the number of revolutions of the viscometer changed at a constant temperature and calculating the ratio of the two viscosities. The numbers of revolutions of the rotational viscometer may be 0.25 rpm and 2.5 rpm at 25° C., for example.

The flux resin composition (X) preferably has, at 25° C. and 2.5 rpm, a viscosity falling within the range from 10 Pa·s to 250 Pa·s and a thixo ratio falling within the range from 1.5 to 8.

The thixo agent (C) may be one or more substances selected from the group consisting of: 1,3:2,4-bis-O-benzylidene-D-glucitol (dibenzylidene sorbitol) (product name: Gelol D manufactured by New Japan Chemical Co., Ltd.); 1,3:2,4-bis-O-(4-methylbenzylidene)-D-sorbitol (product name: Gelol MD manufactured by New Japan Chemical Co., Ltd.); and N, N'-methylene bis(stearamide) (product name: Bisamide LA manufactured by Mitsubishi Chemical Corporation).

(4) Activator (D)

The activator (D) has the function of removing a metal oxide film. Therefore, adding the activator (D) to the flux resin composition (X) may impart a flux action to the flux resin composition (X). As used herein, the "flux action" means a reduction action of removing an oxide film formed on the surface of a metal to which solder is applied, and the action of lowering the surface tension of the molten solder and improving the wettability of the solder to the bonding metal surface.

The activator (D) preferably includes at least one of an organic acid (D1) having a carboxyl group equivalent falling within the range from 40 g/mol to 400 g/mol and a melting point equal to or lower than 220° C. or an amine (D2) having a nitrogen atom equivalent falling within the range from 10 g/mol to 300 g/mol and a melting point equal to or lower than 220° C. Using such an activator (D) with a melting point equal to or lower than 220° C. allows, even when solder having a melting point of around 200° C. or equal to or higher than 200° C. is used, an oxide film of the solder to be removed before the solder is melted. As used herein, the "carboxyl group equivalent" refers to a value represented by the ratio of the molar molecular weight (g) to the number of carboxyl groups (mol) per molecule and the "nitrogen atom equivalent" refers to a value represented by the ratio of the molar molecular weight (g) to the number of nitrogen atoms (mol) per molecule.

The organic acid (D1) may include, for example, one or more substances selected from the group consisting of a rosin component material, adipic acid, glutaric acid, succinic acid, malonic acid, citric acid, suberic acid (cork acid), sebacic acid, and pimelic acid. The organic acid (D1) preferably includes, among other things, succinic acid (having a carboxyl group equivalent of 59 g/mol), glutaric acid (having a carboxyl group equivalent of 66 g/mol), adipic acid (having a carboxyl group equivalent of 73 g/mol), suberic acid (cork acid) (having a carboxyl group equivalent of 87 g/mol), sebacic acid (having a carboxyl group equivalent of 101 g/mol), and Tsunodime 395 (having a carboxyl group equivalent of 288 g/mol).

The amine (D2) is not limited to any particular one as long as the amine may be used as a flux, but may include, for example, one or more substances selected from the group consisting of various amine salts, alkanolamine, and guanidine. The amine (D2) particularly preferably includes, among other things, diethanolamine (having a nitrogen atom equivalent of 105 g/mol), triethanolamine (TEA) (having a nitrogen atom equivalent of 149 g/mol), triisopropanolamine (having a nitrogen atom equivalent of 191 g/mol), 1,3-diphenylguanidine (having a nitrogen atom equivalent of 70 g/mol), and 1,3-di-o-tolylguanidine (having a nitrogen atom equivalent of 80 g/mol).

The activator (D) may include some additional components other than the organic acid (D1) and the amine (D2). The activator (D) may include an organic acid or an amine having a melting point higher than 220° C.

(5) Phenolic Compound (E)

The phenolic compound (E) is in liquid state at normal temperature. The phenolic compound (E) contains a phenol novolac (which is a novolac type phenolic resin). As the phenol novolac, the compound expressed by the following Formula (13) may be used, for example. The phenolic compound (E) may also contain a phenolic compound other than the phenol novolac. That is to say, the phenol novolac and a phenolic compound other than the phenol novolac may be used in combination as the phenolic compound (E). A phenolic compound in solid state at normal temperature may be used to be dissolved or dispersed in the phenolic compound in liquid state at normal temperature.

The flux resin composition (X) according to this embodiment is in liquid state at normal temperature and contains a phenol novolac. Thus, the flux resin composition (X) according to this embodiment may increase the coverage rate of the cured product, compared to a flux resin composition containing no phenolic compound in liquid state and a flux resin composition containing no phenol novolac. The flux resin composition (X) according to this embodiment may increase the coverage rate, compared to, for example, a situation where the diallyl bisphenol A expressed by Formula (14) is used as a phenolic compound.

The phenol novolac preferably has a weight average molecular weight falling within the range from 200 to 10000, more preferably falling within the range from 225 to 8000, and even more preferably falling within the range from 250 to 6000. Using such a phenol novolac allows the coverage rate of the flux resin composition (X) to be increased. Note that the weight average molecular weight is a polystyrene converted value measured by gel permeation chromatography (GPC).

The phenol novolac preferably has an OH group equivalent (g/mol) falling within the range from 50 to 1500, more preferably within the range from 50 to 1000, and even more preferably within the range from 100 to 500. Using such a phenol novolac allows the coverage rate of the flux resin composition (X) to be increased. Note that the OH group equivalent was measured in compliance with the JIS K 0070 standard.

The phenolic compound (E) mainly contributes to increasing the coverage rate of the cured product of the flux resin composition (X). In addition, part of the phenolic compound (E) also serves as a curing agent of the epoxy resin (A).

As used herein, the "coverage rate" refers to the ratio of the height of a reinforcing portion to the height of a bump in the electronic component and the mounting structure. The higher the coverage rate is, the greater the height, and the larger the area, of the reinforcing portion that covers the bump are. This allows the joint between the conductor and the bump to be reinforced sufficiently. Consequently, this allows the reinforcing portion to reinforce the bump even more effectively.

If the height (dimension) of the top of the bump 30, which is bonded to the conductor 210, as measured from the surface of the circuit board of the electronic component body 200, for example, is designated by HB and the height (dimension) of the top of the reinforcing portion 4 as measured from the surface of the circuit board of the electronic component body 200, for example, is designated by HR, then the coverage rate may be calculated by the following equation:

Coverage rate(%) = (height of reinforcing portion / height of bump) × 100

$= HR / HB \times 100$

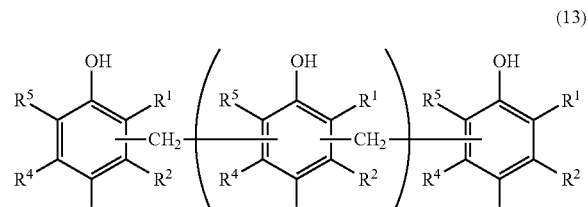
(13)

where n indicates an integer falling within the range from 1 to 10, $R^1$-$R^5$ each independently indicate a hydrogen atom, an alkyl group having 1-20 carbon atoms, an awl group, a vinyl group, or an allyl group, and $R^1$-$R^5$ may be different from one benzene ring to another (e.g., $R^1$ on the rightmost benzene ring may be different from $R^1$ on the leftmost benzene ring).

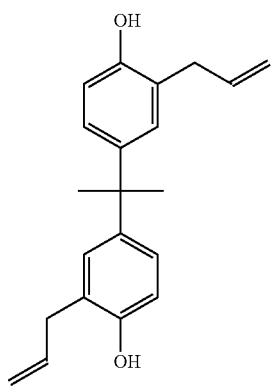
(14)

(6) Other Components (F)

The flux resin composition (X) may include additional components other than the epoxy resin (A), the imidazole compound (B), the thixo agent (C), the activator (D), and the phenolic compound (E). Examples of those other components include a component modifier such as rosin, a filler, and a solvent.

(7) Contents of Respective Components

A flux resin composition (X) according to this embodiment contains, with respect to the total weight of the flux resin composition (X): 60% by weight to 80% by weight of an epoxy resin (A); 0.01% by weight to 2% by weight of an imidazole compound (B); 1% by weight to 5% by weight of a thixo agent (C); 4% by weight to 20% by weight of an activator (D); and 7% by weight to 30% by weight of a phenolic compound (E), where the total weight of the flux resin composition (X) is obtained by adding together the respective weights of the epoxy resin (A), the imidazole compound (B), the thixo agent (C), the activator (D), the phenolic compound (E), and the other components (F).

Also, the flux resin composition (X) according to this embodiment contains an epoxy resin (A1) with rigidity, the content of which falls within the range from 15% by weight to 40% by weight with respect to the total weight of the flux resin composition (X). This enables increasing the glass transition temperature of a cured product of the flux resin composition (X). The content of the epoxy resin (A1) with respect to the total weight of the flux resin composition (X) is preferably equal to or greater than 25% by weight and more preferably equal to or greater than 30% by weight.

Note that if the epoxy resin (A) consists essentially of the epoxy resin (A1) alone, then the epoxy resin (A) would become solid and could not be supplied in some cases. That is why the epoxy resin (A1) preferably accounts for 80% by weight or less of the entire epoxy resin (A). Also, the balance of the epoxy resin (A), other than the epoxy resin (A1), may be an epoxy resin (A2).

In the flux resin composition (X) according to this embodiment, of which the respective components have the contents described above, a cured product thereof has a high glass transition temperature. In addition, the flux resin composition (X) also exhibits good storage stability and may increase the coverage rate of the reinforcing portion that is a cured product.

In the flux resin composition (X), setting the content of the epoxy resin (A) with respect to the total weight of the flux resin composition (X) within the range from 60% by weight to 80% by weight enables increasing the glass transition temperature of the flux resin composition (X) that has been cured, thus improving the storage stability of the flux resin composition (X).

In addition, in the flux resin composition (X), setting the content of the imidazole compound (B) with respect to the total weight of the flux resin composition (X) within the range from 0.01% by weight to 2% by weight improves the storage stability of the flux resin composition (X).

Furthermore, in the flux resin composition (X), setting the content of the thixo agent (C) with respect to the total weight of the flux resin composition (X) within the range from 1% by weight to 5% by weight makes it easier to allow the viscosity at 25° C. and 2.5 rpm to fall within the range from 10 Pa·s to 130 Pa·s and the thixo ratio (at 25° C., 0.25 rpm/2.5 rpm) to fall within the range from 1.5 to 8, thus making the flux resin composition (X) applicable to printing, transfer, and feeding methods using a dispenser, for example. If the thixo ratio were less than 1.5, then it would be difficult to maintain the shape of the flux resin composition (X) that has been fed for printing, thus increasing the chances of causing a bridge. On the other hand, if the content of the thixo agent (C) were so much as to make the thixo ratio greater than 8, then it would be difficult to remove the flux resin composition (X) from a printing mask, thus increasing the chances of causing chipping.

Furthermore, in the flux resin composition (X), setting the content of the activator (D) with respect to the total weight of the flux resin composition (X) within the range from 4% by weight to 20% by weight makes it easier to impart a flux property to the flux resin composition (X), thus improving the storage stability.

Furthermore, in the flux resin composition (X), setting the content of the phenolic compound (E) with respect to the total weight of the flux resin composition (X) within the range from 7% by weight to 30% by weight makes it easier to increase the coverage rate of the flux resin composition (X) (to the range of 20-30%, for example).

(8) Property

In the flux resin composition (X) according to this embodiment, the time it takes for a value calculated by (viscosity of the flux resin composition after storage/viscosity of the flux resin composition at the beginning of the storage)×100(%) to reach 120% since the flux resin composition has started to be stored at 25° C. is equal to or longer than 24 hours (which is a property corresponding to the "life" to be described later), and therefore, the flux resin composition (X) has excellent storage stability. In addition, the flux resin composition (X) according to this embodiment allows solder balls to have a wet spreadability before and after the reflow process (which is a property corresponding to the "wet spreadability" to be described later) of 50% or more, thus achieving good solder wettability during the reflow process. Furthermore, in the flux resin composition (X) according to this embodiment, a cured product thereof has a glass transition temperature equal to or higher than 85° C. (which is a property corresponding to the "glass transition temperature (Tg)" to be described later), thus allowing the cured product to achieve excellent reinforcement effect at the solder-bonded portion.

2-2. Electronic Component and its Manufacturing Method

The configuration of an electronic component 100 to which the flux resin composition (X) is applied, and a manufacturing method thereof will be described below.

(1) Configuration of Electronic Component

Figure 2:
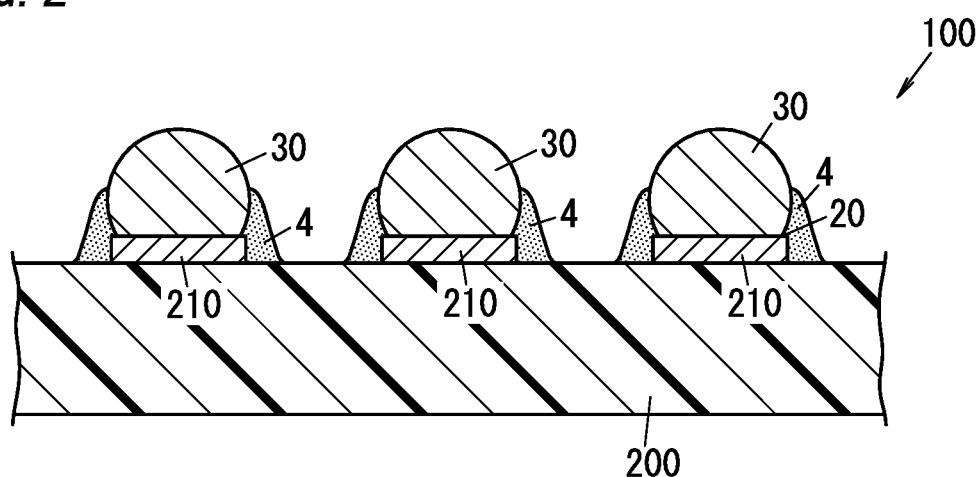
FIG. 2 is a schematic cross-sectional view illustrating an exemplary electronic component according to the exemplary embodiment of the present disclosure.

The electronic component 100 according to this embodiment will be described with reference to FIG. 2. Note that the configuration of the electronic component 100 to be described below is only an example and should not be construed as limiting.

The electronic component 100 may be, but does not have to be, a surface-mount semiconductor chip, for example. The semiconductor chip may be, but does not have to be, a BGA (ball-grid array) or a WLP (wafer level package), for example.

The electronic component 100 includes an electronic component body 200, conductors 210, solder bumps 30, and reinforcing portions 4.

The conductors 210 are formed on the surface of the electronic component body 200, and therefore, exposed to the outside on the surface of the electronic component body 200. If the electronic component 100 is a WLP, the electronic component body 200 includes, for example, a silicon substrate with a rewiring layer, and the conductors 210 are, for example, pillars electrically connected to the rewiring layer. If the electronic component 100 is a BGA, the electronic component body 200 is, for example, a package formed by encapsulating a die (chip) mounted on a substrate with an encapsulation resin, and the conductors 210 are, for example, electrode pads electrically connected to the die. The structure of the electronic component body 200 may be modified appropriately according to the type of the electronic component 100 and should not be construed as limiting.

The bumps 30 are arranged on, and electrically connected to, the conductors 210. Therefore, a joint 20 is formed between each bump 30 and an associated conductor 210. The bumps 30 may be, but do not have to be, made of, for example, SAC solder, or tin-copper based (Sn—Bi based) solder. The Sn—Bi based solder may contain, in addition to Sn and Bi, at least one material selected from the group consisting of Ag, Ni, Fe, Ge, Cu and In. To improve the mechanical performance of the Sn—Bi based solder, the Sn—Bi based solder preferably contains at least one material selected from the group consisting of Ag, Ni, Fe, and Ge.

The reinforcing portions 4 are a cured product of the flux resin composition (X). In the electronic component 100, the reinforcing portions 4 are adhered to the outside of the respective joints 20 between the bumps 30 and the conductors 210. In other words, in the electronic component 100, a cured product of the flux resin composition (X) is adhered to the outside of the respective joints 20 between the bumps 30 and the conductors 210. Therefore, the reinforcing portions 4 allow reinforcing the joints 20 between the bumps 30 and the conductors 210 and thereby improving the connection reliability of the electronic component 100.

(2) Manufacturing Method of Electronic Component

A manufacturing method of the electronic component 100 will be described with reference to FIGS. 3A-3C.

Figure 3A:
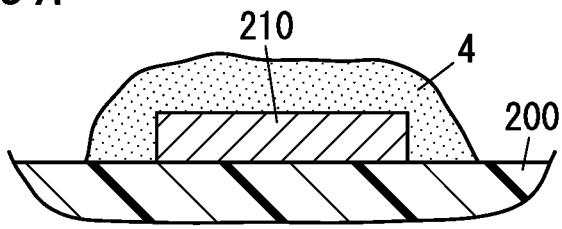
FIGS. 3A-3C are schematic cross-sectional views illustrating an exemplary manufacturing method of the electronic component.

First, an electronic component body 200 including a conductor 210 is provided and the flux resin composition (X) is arranged to cover the conductor 210 (see FIG. 3A). The arranging method of the flux resin composition (X) may be, but does not have to be, for example, a printing method such as an inkjet method or a transfer method.

Figure 3B:
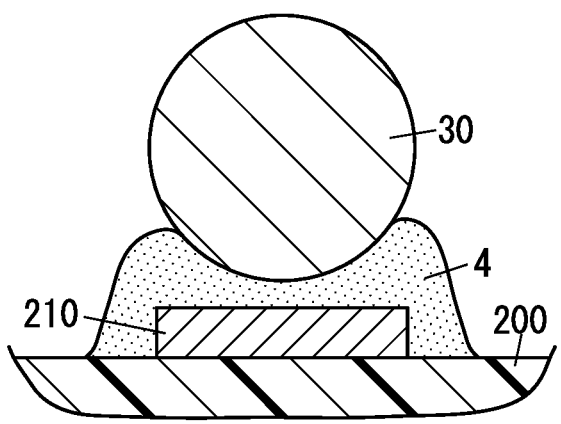
Figure 3C:
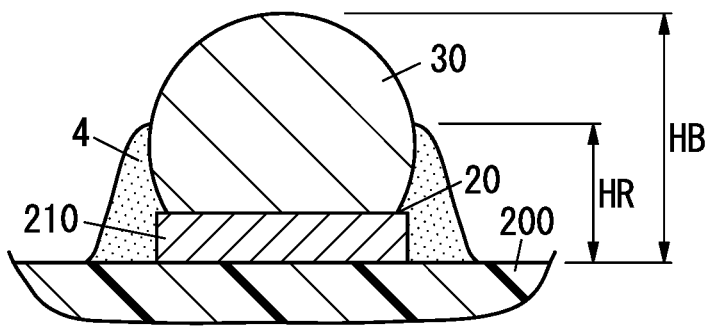

Next, a bump 30 is disposed above the conductor 210 to bring the bump 30 into contact with the flux resin composition (X) (see FIG. 3B). As the bump 30, a solder ball may be used, for example.

Subsequently, the bump 30 and the flux resin composition (X) are heated in the state shown in FIG. 3B. The heating method may be, but does not have to be, heating with a reflow furnace, for example. In that case, the bump 30 and the flux resin composition (X) may be heated following, for example, the reflow profile as shown in FIG. 1.

The flux property imparted by the flux resin composition (X) and a method of making a reinforcing portion to reinforce the joint between a conductor and a solder bump will now be described.

A conductor and a solder bump may be electrically connected to each other by placing the bump over the conductor and melting the bump. The joint between the conductor and the bump may be reinforced by applying a cured product of the flux resin composition (X) to the joint between the conductor and the bump. For example, as the bump and the flux resin composition (X) are heated in a state where the flux resin composition (X) is placed between the conductor and the bump, the viscosity of the flux resin composition (X) decreases, causing the flux resin composition (X) to serve as a flux while flowing. As the flux resin composition (X) flows, the bump comes into contact with the conductor. The bump melts and adheres to the conductor while the flux resin composition (X) maintains its flowability. At this time, the flux resin composition (X) adheres to the outside of the joint between the conductor and the bump and is cured in that state to make the reinforcing portion. In this manner, the conductor and the bump may be electrically connected to each other and the joint between the conductor and the bump may be reinforced by adhering the reinforcing portion that is a cured product of the flux resin composition (X) to the outside of the joint. In order to melt the bump, the bump and the flux resin composition (X) are heated to a temperature higher than the melting point of the solder.

An exemplary heating temperature profile and a typical variation in the viscosity of the flux resin composition (X) when the conductor and the bump are electrically connected to each other while the reinforcing portion is being made are shown in the graph of FIG. 1. In the graph of FIG. 1, the dashed curve indicates the heating temperature, and the solid curve indicates the viscosity of the flux resin composition (X). In FIG. 1, T3 (° C.) is the melting point of the bump, and T1 (° C.) and T2 (° C.) are particular temperatures which meet the relation: room temperature<T1<T2<T3.

First, as shown in FIG. 1, the heating temperature is increased from room temperature to T1 (° C.). Next, the heating temperature is increased to T2 (° C.). Then, the heating temperature is increased to a temperature higher than T3 (° C.) (i.e., increased to a peak temperature).

Subsequently, the heating temperature is lowered to room temperature.

The melting point T3 (° C.) of the bump depends on the composition of the solder as a constituent material of the bump. For instance, if the bump is made of a Sn—Ag—Cu (SAC) based solder, T3 (° C.) falls within the range from 217° C. to 230° C.

T1 (° C.) is preferably defined around the temperature at which the flux resin composition (X) starts melting. T1 (° C.) may, but does not have to, fall within the range from 140° C. to 160° C., for example.

T2 (° C.) is preferably defined to be a temperature higher than T1 (° C.) and lower than the temperature at which the flux resin composition (X) starts curing. T2 (° C.) may, but does not have to, fall within the range from 160° C. to 200° C., for example. The peak temperature is preferably defined to be a temperature higher than T3 (° C.) and higher than the temperature at which the flux resin composition (X) starts curing. The peak temperature may, but does not have to, fall within the range from 232° C. to 255° C., for example. The temperature increase rate of the heating temperature at which the heating temperature rises from room temperature to T1 (° C.) may be, but does not have to be, 5° C./second or less, for example. The time it takes for the heating temperature to rise from T1 (° C.) to T2 (° C.) may, but does not have to, fall within the range from 60 seconds to 100 seconds, for example. The temperature increase rate at which the heating temperature rises from T2 (° C.) to the peak temperature (° C.) may be, but does not have to be, 4° C./second or less, for example. The duration for which the heating temperature remains equal to or higher than T3 (° C.) may, but does not have to, fall within the range from 30 seconds to 90 seconds, for example.

As shown in FIG. 1, from around T1 (° C.), the viscosity of the flux resin composition (X) starts to decrease to cause the flux resin composition (X) to start flowing. In FIG. 1, "melting" refers to melting of the epoxy resin (A). Therefore, the time it takes for the flux resin composition (X) to start flowing since the start of the heating may be controlled by controlling the temperature increase rate of the heating temperature from room temperature to T1 (° C.). As shown in FIG. 1, even if the heating temperature is increased from T1 (° C.) to T2 (° C.), the flux resin composition (X) is maintained at a low viscosity. Thus, the duration for which the flux resin composition (X) maintains flowability may be controlled by controlling the temperature increase rate from T1 (° C.) to T2 (° C.). This allows the flux resin composition (X) to flow sufficiently to reduce the chances of causing voids in the reinforcing portion 4.

As shown in FIG. 1, as the heating temperature rises from T2 (° C.) toward the peak temperature, the viscosity of the flux resin composition (X) hardly increases, and the state in which the flux resin composition (X) has flowability is maintained for a while even after the heating temperature has exceeded T3 (° C.). Subsequently, the viscosity starts to increase steeply. That is to say, this makes it easier, even after the heating temperature has exceeded the melting point of the solder, for the flux resin composition (X) to maintain flowability for a while. Therefore, flowing of the flux resin composition (X) makes it easier for the bump to come into contact with the conductor and to be melted and adhered to the bump. In addition, this reduces the chances of the flux resin composition (X) inhibiting a self-alignment effect of the melted bump. Furthermore, since the flux resin composition (X) contains the activator (D), the oxide film of the solder may be quickly removed by the flux action of the activator (D) while the heating temperature rises from T2 (° C.) to T3 (° C.) to cause the flux resin composition (X) to be cured. Even after the viscosity of the flux resin composition (X) has increased with the ring opening and polymerization of the epoxy resin (A), the activation action of the activator (D) still persists as shown in FIG. 1. This allows the conductor and the solder to be connected smoothly, thus further reducing the chances of causing a contact failure.

The ring opening of the epoxy group with the flux resin composition (X) adhered to the joint between the conductor and the solder causes polymerization. Thus, the reinforcing portion adhered to the outside (outer surface) of the joint between the conductor and the solder is formed by causing the flux resin composition (X) to be cured. As shown in FIG. 1, the viscosity of the flux resin composition (X) continues increasing even if the heating temperature has fallen from the peak temperature toward room temperature. Therefore, the flux resin composition (X) may be rapidly cured with the flux resin composition (X) still adhered to the outside of the joint between the conductor and the solder.

Such viscosity behavior is realized by the flux resin composition (X) probably because the imidazole compound (B) has a high melting temperature. The curing reaction of the flux resin composition (X) hardly proceeds, and the low viscosity of the flux resin composition (X) may be maintained, in the range from T1 (° C.) to T3 (° C.), since the melting temperature of the imidazole compound (B) is equal to or higher than 130° C.

The flux resin composition (X) is rapidly cured, even if the heating temperature has fallen from the peak temperature toward room temperature. This is not because the temperature of the flux resin composition (X) falls steeply but because the flux resin composition (X) maintains, for a certain period of time, a temperature high enough to cause the curing reaction between the epoxy resin (A) and the imidazole compound (B) to proceed. Thus, a cured product of a flux resin composition (X) in which an ideal three-dimensional crosslinked structure is formed, and which has a high glass transition temperature (Tg) is obtained. Applying such a flux resin composition (X) to the electronic component 100 shown in FIG. 2 enables forming a reinforcing portion 4 adhered to the outside of the joint 20 between the conductor 210, included in the electronic component body 200, and the bump 32.

Figure 4A:
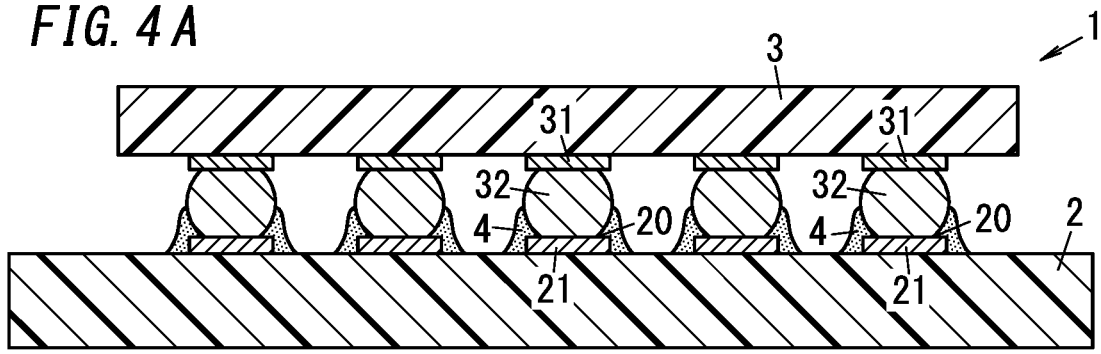
FIGS. 4A-4C are schematic cross-sectional views of exemplary mounting structures according to the exemplary embodiment of the present disclosure.

Furthermore, applying the flux resin composition (X) to the mounting structure 1 shown in FIG. 4A enables forming a reinforcing portion 4 adhered to the joint 20 between the first conductor 21 and the bump 32, when connecting the first conductor 21 of the circuit board 2 to the bump 32.

The flux resin composition (X) according to this embodiment may be used to form, after the conductor and the bump have been electrically connected to each other, a reinforcing portion covering the joint between the conductor and the bump.

As described above, the flux resin composition (X) will be maintained at a low viscosity until the bump 30 melts. In addition, even after the bump 30 has started melting, the viscosity of the flux resin composition (X) does not increase immediately but starts to increase steeply after a while. This allows the flux resin composition (X) to start to be cured after the flux resin composition (X) has been adhered to the outside of the joint 20 between the conductor 210 and the bump 30. Thus, the conductor 210 and the bump 30 may be connected as intended. Consequently, this reduces the chances of causing a contact failure between the conductor 210 and the bump 30. In addition, this also allows a cured product of the flux resin composition (X) to be adhered to the outside of the joint 20 between the conductor 210 and the bump 30. In this manner, the joint 20 between the conductor 210 and the bump 30 may be reinforced.

2-3. Mounting Structure and its Manufacturing Method (1) Mounting Structure

A mounting structure 1 according to this embodiment will be described with reference to FIGS. 4A-4C. Note that the configuration of the mounting structure 1 to be described below is only an example and should not be construed as limiting.

The mounting structure 1 includes a circuit board 2, an electronic component 3, bumps 32, and reinforcing portions 4.

The circuit board 2 may be a motherboard, a package board, or an interposer board, for example. The circuit board 2 may be, for example, an insulating board made of glass epoxy, polyimide, polyester, a ceramic, or any other suitable material. The first conductor 21 is formed on the surface of the circuit board 2. Thus, the circuit board 2 includes the first conductor 21. The first conductor 21 may be, but does not have to be, wiring made of a conductor including a metal such as copper or a copper alloy. Optionally, the first conductor 21 may include, on its surface, a plating layer such as a nickel plating layer, a nickel-gold plating layer, or a gold plating layer.

The electronic component 3 may be a semiconductor chip, for example, and may more specifically be a flip-chip bonded chip such as a ball-grid array (BGA), a land-grid array (LGA), or a chip size package (CSP) chip. Alternatively, the electronic component 3 may also be a package on package (PoP) chip. The second conductor 31 is formed on the surface of the electronic component 3. Thus, the electronic component 3 includes the second conductor 31. The second conductor 31 may be, but does not have to be, electrode pads made of a conductor including a metal such as copper or a copper alloy, for example. Optionally, the second conductor 31 may include, on its surface, a plating layer such as a nickel plating layer, a nickel-gold plating layer, or a gold plating layer.

The bumps 32 are fixed between the first conductor 21 of the circuit board 2 and the second conductor 31 of the electronic component 3. The bumps 32 electrically connect the first conductor 21 and the second conductor 31 to each other. The bumps 32 may be made of, for example, solder. In that case, the solder may be, but does not have to be, SAC solder (lead-free solder) or tin-copper based (Sn—Bi based) solder.

Each of the reinforcing portions 4 is a cured product of the flux resin composition (X). In this mounting structure 1, the reinforcing portion 4 is adhered to the outside of each of the joints 20 between the bumps 32 and the first conductor 21. This allows the reinforcing portions 4 to reinforce the joints 20 between the bumps 32 and the first conductor 21 and thereby improve the connection reliability of the mounting structure 1. Note that if the connection reliability were low, then stress, caused by a variation in environmental temperature, for example, would be applied repeatedly, thus sometimes causing a fatigue failure.

In the mounting structure 1 shown in FIG. 4A, the reinforcing portions 4 are adhered to the outside (i.e., the outer surface) of the joints 20 between the first conductor 21 of the circuit board 2 and the bumps 32, but this configuration is only an example and should not be construed as limiting. Alternatively, as in the mounting structure 1 as shown in FIG. 4B, for example, the reinforcing portion 4 may also be adhered to the outside of each of the joints 20 between the second conductor 31 of the electronic component 3 and the bumps 32. Still alternatively, as in the mounting structure 1 as shown in FIG. 4C, for example, the reinforcing portion 4 may be adhered to not only the outside of each of the joints 20 between the first conductor 21 of the circuit board 2 and the bumps 32 but also the outside of each of the joints 20 between the second conductor 31 of the electronic component 3 and the bumps 32.

Figure 4B:
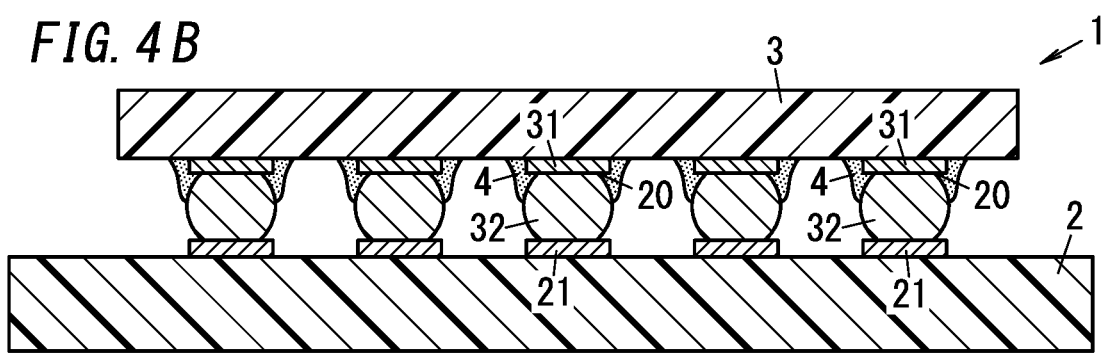
Figure 4C:
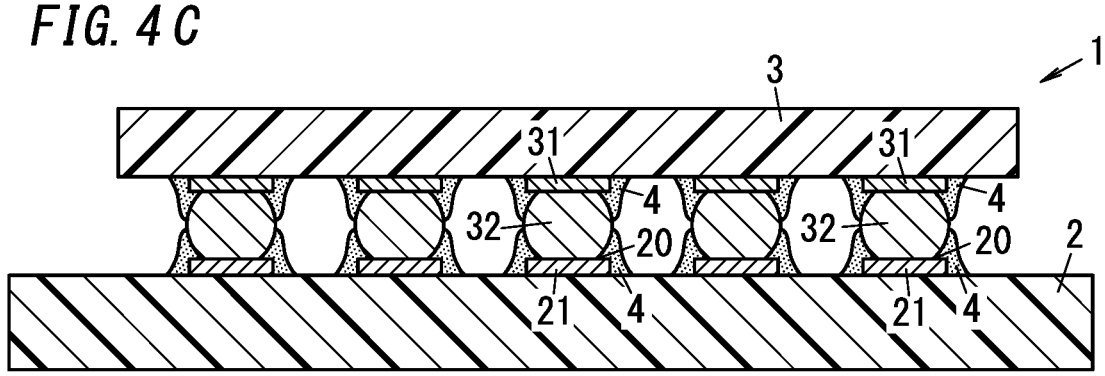

Yet alternatively, if an interval between adjacent parts of the first conductor 21 is short (narrow pitch) in the mounting structures 1 shown in the FIGS. 4A and 4C, or if an interval between adjacent parts of the second conductor 31 is short in the mounting structures 1 shown in FIGS. 4B and 4C, those adjacent parts of the reinforcing portions 4 may be connected together. Optionally, in the mounting structures 1 shown in the FIGS. 4A-4C, all adjacent reinforcing portions 4 may be connected together. In other words, the surface of the circuit board 2 may be covered with the reinforcing portion 4, and the surface of the electronic component 3 may be covered with the reinforcing portion 4.

Furthermore, in the mounting structure 1 shown in FIG. 4C, each of the reinforcing portions 4 adhered to the outside of the joints 20 between the first conductor 21 and the bumps 32 and an associated one of the reinforcing portions 4 adhered to the outside of the joints 20 between the second conductor 31 and the bumps 32 may be connected together. However, if the bumps 32 are heated multiple times at a temperature equal to or higher than the melting point of the solder as a constituent material for the bumps 32 (in, for example, reflow process and repair process), an internal pressure may increase at the time of remelting of the solder, thus possibly causing a solder flash. When the solder flash is brought about, the bumps 32 could expand so much as to cause breakdown to the first conductor 21 and the second conductor 31. Therefore, the reinforcing portions 4 adhered to the outside of the joints 20 between the first conductor 21 and the bumps 32 and the reinforcing portions 4 adhered to the outside of the joints 20 between the second conductor 31 and the bumps 32 are preferably not connected together.

(2) Manufacturing Method of Mounting Structure

A manufacturing method of the mounting structure 1 shown in FIG. 4A will be described with reference to FIGS. 5A-5C.

Figure 5A:
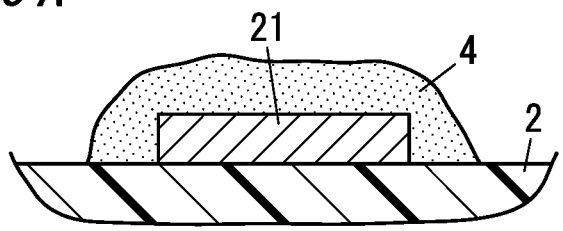
FIGS. 5A-5C are schematic cross-sectional views illustrating an exemplary manufacturing method of the mounting structure.
Figure 5B:
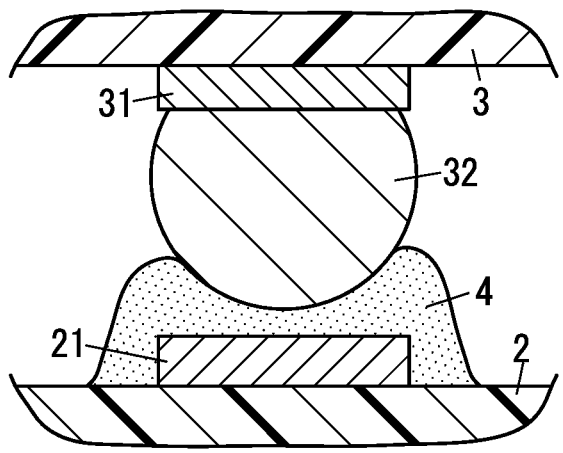
Figure 5C:
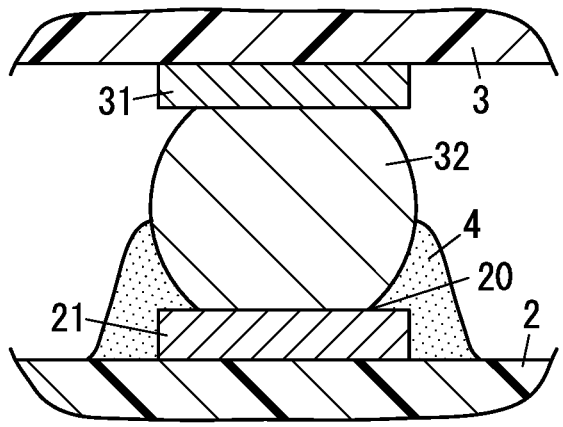

First, a circuit board 2 including a first conductor 21 is provided and the flux resin composition (X) is arranged to cover the first conductor 21 (see FIG. 5A). The arranging method of the flux resin composition (X) may be, but does not have to be, a printing method, a transfer method, or an application method, for example.

Next, an electronic component 3 including a second conductor 31 is provided. The bump 32 is provided on the second conductor 31 and the second conductor 31 and the bump 32 are electrically connected to each other. The electronic component 3 is disposed on the circuit board 2 to bring the bump 32 into contact with the flux resin composition (X) (see FIG. 5B).

Subsequently, the bump 32 and the flux resin composition (X) are heated in the state shown in FIG. 5B. The heating method may be, but does not have to be, heating with a reflow furnace, for example. In that case, the bump 32 and the flux resin composition (X) may be heated following, for example, the reflow profile shown in FIG. 1.

As described above in the "2-2. Electronic component and its manufacturing method" section, the flux resin composition (X) is maintained at a low viscosity until the bump 32 melts. In addition, even if the bump 32 starts melting, the viscosity of the flux resin composition (X) does not immediately increase but starts to increase steeply after a while. Therefore, the flux resin composition (X) may be cured after the outside of the joint 20 between the first conductor 21 and the bump 32 has been covered with the flux resin composition (X). This allows the first conductor 21 and the bump 32 to be connected together smoothly. In addition, this may reduce the chances of causing a contact failure between the first conductor 21 and the bump 32. Furthermore, a cured product of the flux resin composition (X) may be adhered to the outside of the joint 20 between the first conductor 21 and the bump 32. Thus, the joint 20 between the first conductor 21 and the bump 32 may be reinforced with the reinforcing portion 4.

In the manufacturing method of the mounting structure 1 described above, the bump 32 is provided on the second conductor 31, but this configuration is only an example and should not be construed as limiting. Alternatively, the bump 32 may be provided on the first conductor 21, for example. In that case, the flux resin composition (X) is arranged to cover the second conductor 31, and when the second conductor 31 and the bump 32 are connected, the flux resin composition (X) may be cured after the outside of the joint 20 between the second conductor 31 and the bump 32 has been covered with the flux resin composition (X). In that case, as in the mounting structure 1 shown in FIG. 4B, the outside of the joint 20 between the second conductor 31 and the bump 32 may be reinforced with the reinforcing portion 4.

Examples

1. Preparation of Resin Composition

Resin compositions were obtained by mixing the respective components shown in the following Tables 1-3 at the ratios shown in Tables 1-3. The details of the components shown in Tables 1-3 are as follows:

HP-6000L: mixture of naphthalene type epoxy resins expressed by Formulae (5) and (6) having an epoxy group equivalent of 215 and manufactured by DIC Corporation;

HP-4032D: naphthalene type epoxy resin expressed by Formula (1) having an epoxy group equivalent of 136-148 and manufactured by DIC Corporation;

HP-7250: trisphenol methane type epoxy resin expressed by Formula (8) having an epoxy group equivalent of 162 and manufactured by DIC Corporation;

NC-3000-H: biphenyl aralkyl type epoxy resin expressed by Formula (10) having an epoxy group equivalent of 280-300 and manufactured by Nippon Kayaku Co., Ltd.;

YX4000H: biphenyl type epoxy resin expressed by Formula (11) having an epoxy group equivalent of 187-197 and manufactured by Mitsubishi Chemical Corporation;

HP-7200HHH: dicyclopentadiene type epoxy resins expressed by Formula (12) having an epoxy group equivalent of 280-292 and manufactured by DIC Corporation;

YD8125: bisphenol type epoxy resin in liquid state at 25° C.; manufactured by NIPPON STEEL Chemical & Material Co., Ltd.;

YD8170: bisphenol type epoxy resin in liquid state at 25° C.; manufactured by NIPPON STEEL Chemical & Material Co., Ltd.;

2PHZ-PW: 2-phenyl-4,5-dihydroxymethyl imidazole having a melting point of 230° C. and manufactured by Shikoku Chemicals Corporation;

2P4MHZ-PW: 2-phenyl-4-methyl-5-hydroxymethyl imidazole having a melting point of 191-195° C. and manufactured by Shikoku Chemicals Corporation;

2PZ-PW: 2-phenyl imidazole having a melting point of 137-147° C. and manufactured by Shikoku Chemicals Corporation;

2MAOK-PW: an isocyanurate adduct of 2,4-diamino-6-[2'-methylimidazolyl-(1')]-ethyl-s-triazine having a melting point of 260° C. and manufactured by Shikoku Chemicals Corporation;

1,2-DMZ: having a melting point of 36° C. and manufactured by Shikoku Chemicals Corporation;

Adipic acid: manufactured by Tokyo Chemical Industry Co., Ltd.;

Glutaric acid: manufactured by Tokyo Chemical Industry Co., Ltd.;

TEA: triethanolamine manufactured by Tokyo Chemical Industry Co., Ltd.;

1,3-diphenylguanidine manufactured by Tokyo Chemical Industry Co., Ltd.;

Tsunodime 395: containing 94% of dimer acid and manufactured by Tsuno Co., Ltd.;

Gelol D: 1,3:2,4-bis-O-benzylidene-D-glucitol (dibenzylidene sorbitol) manufactured by New Japan Chemical Co., Ltd.;

MEH-8000H: phenol novolac (liquid phenolic resin) expressed by Formula (13), mixture with n=0-10 where $R^1$-$R^5$ each represent a hydrogen atom, having a low viscosity of 1500-3500 [mPa·s] as measured with type E viscometer at 25° C. and an OH equivalent of 141 [g/eq], manufactured by Meiwa Plastic Industries, Ltd.;

MEH-8005: phenol novolac (liquid phenolic resin) expressed by Formula (13), mixture with n=0-10 where $R^1$-$R^5$ each represent a hydrogen atom, having a high viscosity of 4500-7500 [mPa·s] as measured with type E viscometer at 25° C. and an OH equivalent of 133-138 [g/eq], manufactured by Meiwa Plastic Industries, Ltd.;

ELP75: phenol novolac (liquid phenolic resin) expressed by Formula (13), mixture with n=0-10 where $R^1$-$R^5$ each represent a hydrogen atom, having a viscosity of 25 [mPa·s] as measured by type E viscometer at 25° C. and an OH equivalent of 211 [g/eq], manufactured by Gunei Chemical Industry Co., Ltd.;

ELP83H: phenol novolac (liquid phenolic resin) expressed by Formula (13), mixture with n=0-10 where $R^1$-$R^5$ each represent a hydrogen atom, having a viscosity of 25 [mPa·s] as measured with type E viscometer at 25° C. and an OH equivalent of 226 [g/eq], manufactured by Gunei Chemical Industry Co., Ltd.;

Diallyl bisphenol A: diallyl bisphenol A expressed by Formula (14);

Gelol MD: 1,3:2,4-bis-O-(4-methylbenzylidene)-D-sorbitol manufactured by New Japan Chemical Co., Ltd.;

Bisamide LA: N,N'-methylene bis(stearamide) manufactured by Mitsubishi Chemical Corporation;

DEDG: diethylene glycol diethyl ether manufactured by Nippon Nyukazai Co., Ltd.; and HEDG: diethylene glycol monohexyl ether manufactured by Nippon Nyukazai Co., Ltd.

2. Evaluations (1) Viscosity

The viscosities (Pa·s) of the flux resin compositions according to respective examples and comparative examples were measured at 25° C. and 2.5 rpm. A type E viscometer (product number RE-215U manufactured by Toki Sangyo Co., Ltd.) was used to measure the viscosities. The results are summarized in the following Tables 1-3.

(2) Thixo Ratio

The thixo ratios of the flux resin compositions according to respective examples and comparative examples were measured at 25° C. The thixo ratio was calculated as the ratio of the viscosity at 0.25 rpm to the viscosity at 2.5 rpm.

(3) Printability

The degree of printability was determined as follows by printing, with a printer, the flux resin compositions according to respective examples and comparative examples on a substrate having an Ni—Pd—Au pad (conductor) with 41:0 of 300 μm and 0.5 mmP and observing their printed condition through a microscope:

Grade A: if the resin composition caused no shape problem at all;
Grade B: if the resin composition caused no problem in practice although some bridges and chips were present; or
Grade C: if the resin composition had a lot of bridges and chips.

(4) Glass Transition Temperature (Tg)

The glass transition temperatures of the cured products of the flux resin compositions according to the respective examples and comparative examples were measured by thermal mechanical analysis (TMA) (in compliance with the JIS K 7197: 1991):

Grade A: if the glass transition temperature was equal to or higher than 85° C.;
Grade B: if the glass transition temperature fell within the range from 80° C. to lower than 85° C.; or
Grade C: if the glass transition temperature was lower than 80° C.

(5) Wet Spreadability

The wet spreadabilities of the flux resin compositions according to the respective examples and comparative examples are calculated on a copper plate by $\{(D-H)/D\} \times 100(\%)$, where D is the diameter of a solder ball yet to be subjected to the reflow process and H is the height of the solder ball subjected the reflow process. Note that the wet spreadabilities were calculated by a method compliant with the JIS Z3198-3 standard and the reflow process was carried out in accordance with the reflow profile shown in FIG. 1:

Grade A: if the wet spreadability was equal to or greater than 60%;
Grade B: if the wet spreadability was equal to or greater than 50% but less than 60%; or
Grade C: if the wet spreadability was less than 50%.

(6) Life

The life of each of the flux resin compositions according to the respective examples and comparative examples is defined by the time from the beginning through the end of their storage. That is to say, the life was calculated by (viscosity after storage/viscosity at the beginning of storage)×100(%) and determined to be the time that it took for the life to reach 120% (at a storage temperature of 25° C.; the viscosity was measured as in (1)):

Grade A: if the life was equal to or longer than 24 hours;
Grade B: if the life was equal to or longer than 20 hours but shorter than 24 hours; or
Grade C: if the life was shorter than 20 hours.

(7) Coverage Rate

In each of the flux resin compositions according to the respective examples and comparative examples, a bump was formed by mounting a solder ball with a diameter of 300 μm on a substrate having an Ni—Pd—Au pad (conductor) with Φ of 300 μm and 0.5 mmP, thereby calculating the coverage rate by (HR/HB)×100(%), where HR is the height of the reinforcing portion (fillet) and HB is the height of the bump (i.e., the ball mounted). Each of the flux resin compositions was supplied onto the pad through a metallic mask with an opening of 300 μm and a thickness of 60 μm. The reflow process was carried out in accordance with the reflow profile shown in FIG. 1:

Grade A: if the coverage rate was equal to or greater than 10%; or
Grade C: if the coverage rate was less than 10%.

(8) Total Evaluation

The total evaluation of the flux resin composition according to each of the respective examples and comparative examples was made as follows in terms of their printability, wet spreadability, life, and coverage rate:

Grade A: if the flux resin composition was graded A in all of the printability, wet spreadability, life, and coverage rate;
Grade B: if the flux resin composition was graded B in at least one of the printability, wet spreadability, life, or coverage rate and not graded C in any of these parameters; or
Grade C: if the flux resin composition was graded C in at least one of the printability, wet spreadability, life, or coverage rate.

These results of evaluation are summarized in the following Tables 1-3:

TABLE 1

| | Type | Model No. | Ex.1 | Ex.2 | Ex.3 | Ex.4 | Ex.5 | Ex.6 | Ex.7 |
|---|---|---|---|---|---|---|---|---|---|
| Components and contents (% by weight) | Naphthalene type epoxy resin | HP-6000L | 24.5 | 15 | | | | | |
| | | HP-4032D | | | 39.9 | | | | |
| | Trisphenol methane type epoxy resin | HP-7250 | | | | | 21.9 | | |
| | Biphenyl aralkyl type epoxy resin | NC-3000-H | | | | | | 27.7 | |
| | Biphenyl type epoxy resin | YX4000H | | | | | | | 22.1 |
| | Dicyclopentadiene type epoxy resin | HP-7200HHH | | | | | | | | 25.5 |
| | Bisphenol type epoxy resin | YD8125 | 31.4 | 37.8 | 8.1 | 27.7 | 35.1 | 28.8 | 32.8 |
| | | YDF8170 | 14.0 | 17.4 | 21.7 | 10.5 | 17.1 | 12.2 | 14.6 |
| | Imidazole compound | 2PHZ-PW | 0.3 | 0.3 | | 0.3 | | | 0.3 |
| | | 2P4MHZ-PW | | | 0.3 | | | | |

TABLE 1-continued

|  | Type | Model No. | Ex.1 | Ex.2 | Ex.3 | Ex.4 | Ex.5 | Ex.6 | Ex.7 |
|---|---|---|---|---|---|---|---|---|---|
|  |  | 2PZ-PW |  |  |  |  | 0.3 |  |  |
|  |  | 2MAOK-PW |  |  |  |  |  | 0.2 |  |
|  |  | 1,2-DMZ |  |  |  |  |  |  |  |
|  | Activator | Adipic acid | 2.2 |  | 2.2 | 2.3 |  | 6.3 |  |
|  |  | Glutaric acid |  | 2.2 |  |  | 2.3 |  | 1.1 |
|  |  | TEA |  |  |  | 2.9 |  |  | 1.4 |
|  |  | 1,3-diphenyl guanidine | 2.9 | 2.9 |  | 2.9 | 3.00 | 6.9 | 1.8 |
|  |  | Tsunodime 395 | 2.9 | 2.9 | 2.9 | 2.9 | 3.00 | 6.6 |  |
|  | Phenolic compound | MEH-8000H | 17.7 |  |  | 27.4 |  | 13.0 |  |
|  |  | MEH-8005 |  | 17.7 |  |  |  |  | 18.3 |
|  |  | ELPC75 |  |  | 17.9 |  |  |  |  |
|  |  | ELP83H |  |  |  |  |  | 7.3 |  |
|  |  | Diallyl bisphenol A |  |  |  |  |  |  |  |
|  | Thixo agent | Gelol D | 2.3 | 2.3 | 2.3 | 2.3 |  |  | 2.4 |
|  |  | Gelol MD |  |  |  |  | 2.4 |  |  |
|  |  | Bisamide LA |  |  |  |  |  | 2.2 |  |
|  | Solvent | DEDG | 1.8 | 1.8 | 1.8 | 1.8 |  |  | 1.8 |
|  |  | HEDG |  |  |  |  | 1.8 | 1.7 |  |
| Evaluation | Viscosity (Pa · s) | Type E viscometer, 25° C., 2.5 rpm | 85 | 60 | 90 | 52 | 100 | 94 | 99 |
|  | Thixo ratio (0.25 rpm/2.5 rpm) | Type E viscometer, 25° C. | 3.4 | 5.1 | 3.1 | 4.8 | 2.9 | 4.2 | 4.8 |
|  | Printability | Ni—Pd—Au pad substrate | A | A | A | A | A | A | A |
|  | Tg(° C.) | TMA | A | A | A | A | A | A | A |
|  | Wet spreadability | on copper plate | A | A | A | A | A | A | A |
|  | Life | Viscosity increase rate | A | A | A | A | A | A | A |
|  | Coverage rate | Ratio of cured product's height to bump height | A | A | A | A | A | A | A |
| Total evaluation |  |  | A | A | A | A | A | A | A |

TABLE 2

|  | Type | Model No. | Ex.8 | Ex.9 | Ex.10 | Ex.11 | Cmp. Ex.1 | Cmp. Ex.2 | Cmp. Ex.3 |
|---|---|---|---|---|---|---|---|---|---|
| Components and contents (% by weight) | Naphthalene type epoxy resin | HP-6000L |  |  |  |  | 27.4 | 24.4 | 13 |
|  |  | HP-4032D |  |  |  |  |  |  |  |
|  | Trisphenol methane type epoxy resin | HP-7250 | 23.9 | 24.8 | 24.5 | 24.0 |  |  |  |
|  | Biphenyl aralkyl type epoxy resin | NC-3000-H |  |  |  |  |  |  |  |
|  | Biphenyl type epoxy resin | YX4000H |  |  |  |  |  |  |  |
|  | Dicyclopentadiene type epoxy resin | HP-7200HHH |  |  |  |  |  |  |  |
|  | Bisphenol type epoxy resin | YD8125 | 30.7 | 31.8 | 31.5 | 30.9 | 35.5 | 31.5 | 58.0 |
|  |  | YDF8170 | 13.7 | 14.1 | 14.0 | 13.7 | 15.8 | 14.0 |  |
|  | Imidazole compound | 2PHZ-PW | 0.3 | 0.3 | 0.01 | 1.96 | 0.45 | 0.3 | 0.5 |
|  |  | 2P4MHZ-PW |  |  |  |  |  |  |  |
|  |  | 2PZ-PW |  |  |  |  |  |  |  |
|  |  | 2MAOK-PW |  |  |  |  |  |  |  |
|  |  | 1,2-DMZ |  |  |  |  |  |  |  |
|  | Activator | Adipic acid | 2.2 | 2.3 | 2.2 | 2.2 | 4.1 | 2.2 | 0.8 |
|  |  | Glutaric acid |  |  |  | 2.9 |  |  |  |
|  |  | TEA |  |  |  |  |  |  |  |
|  |  | 1,3-diphenyl guanidine | 2.8 | 3.0 | 2.9 | 2.9 | 5 | 2.9 | 3 |
|  |  | Tsunodime 395 | 2.8 | 3.0 | 2.9 |  | 5 | 2.9 | 3 |
|  | Phenolic compound | MEH-8000H | 17.3 | 17.8 | 17.9 | 17.4 |  |  | 17.4 |
|  |  | MEH-8005 |  |  |  |  |  |  |  |
|  |  | ELPC75 |  |  |  |  |  |  |  |
|  |  | ELP83H |  |  |  |  |  |  |  |
|  |  | Diallyl bisphenol A |  |  |  |  |  | 17.7 |  |
|  | Thixo agent | Gelol D | 4.6 | 1.1 | 2.3 | 2.3 | 2.6 | 2.3 | 2.3 |
|  |  | Gelol MD |  |  |  |  |  |  |  |
|  |  | Bisamide LA |  |  |  |  |  |  |  |
|  | Solvent | DEDG | 1.7 | 1.8 | 1.8 | 1.7 | 4.1 | 1.8 | 2 |
|  |  | HEDG |  |  |  |  |  |  |  |
| Evaluation | Viscosity (Pa · s) | Type E viscometer, 25° C., 2.5 rpm | 110 | 88 | 73 | 91 | 70 | 63 | 55 |
|  | Thixo ratio (0.25 rpm/2.5 rpm) | Type E viscometer, 25° C. | 7.5 | 2.5 | 2.9 | 3.8 | 3.2 | 3.4 | 3.7 |
|  | Printability | Ni—Pd—Au pad substrate | A | A | A | A | A | A | A |
|  | Tg(° C.) | TMA | A | A | A | A | A | C | C |
|  | Wet spreadability | on copper plate | A | A | A | A | A | A | A |
|  | Life | Viscosity increase rate | A | A | A | A | A | A | A |

TABLE 2-continued

| | Type | Model No. | Ex.8 | Ex.9 | Ex.10 | Ex.11 | Cmp. Ex.1 | Cmp. Ex.2 | Cmp. Ex.3 |
|---|---|---|---|---|---|---|---|---|---|
| | Coverage rate | Ratio of cured product's height to bump height | A | A | A | A | C | C | A |
| Total evaluation | | | A | A | A | A | C | C | C |

TABLE 3

| | Type | Model No. | Cmp. Ex.4 | Cmp. Ex.5 | Cmp. Ex.6 | Cmp. Ex.7 | Cmp. Ex.8 | Cmp. Ex.9 | Cmp. Ex.10 | Cmp. Ex.11 |
|---|---|---|---|---|---|---|---|---|---|---|
| Components and contents (% by weight) | Naphthalene type epoxy resin | HP-6000L | 45 | | | | | | | |
| | | HP-4032D | | | | | | | | |
| | Trisphenol methane type epoxy resin | HP-7250 | | 24.0 | 24.0 | 24.0 | 24.0 | 24.0 | 26.0 | 22.0 |
| | Biphenyl aralkyl type epoxy resin | NC-3000-H | | | | | | | | |
| | Biphenyl type epoxy resin | YX4000H | | | | | | | | |
| | Dicyclopentadiene type epoxy resin | HP-7200HHH | | | | | | | | |
| | Bisphenol type epoxy resin | YD8125 | 26.0 | 30.9 | 30.9 | 30.9 | 30.9 | 30.9 | 30.9 | 26.3 |
| | | YDF8170 | | 13.7 | 13.7 | 13.7 | 13.7 | 13.7 | 15.4 | 13.7 |
| | Imidazole compound | 2PHZ-PW | 0.5 | 0.5 | 0.5 | | 0.005 | 2.5 | | |
| | | 2P4MHZ-PW | | | | | | | | |
| | | 2PZ-PW | | | | | | | | |
| | | 2MAOK-PW | | | | | | | | |
| | | 1,2-DMZ | | | | 0.5 | | | | |
| | Activator | Adipic acid | 0.8 | 3.7 | 2.2 | 2.2 | 2.2 | 2.2 | 1 | 7 |
| | | Glutaric acid | | 2.9 | 2.9 | 2.9 | 2.9 | 2.9 | | |
| | | TEA | | | | | | | | |
| | | 1,3-diphenyl guanidine | 3 | 2.9 | 2.9 | 2.9 | 2.9 | 2.9 | 1.4 | 9 |
| | | Tsunodime 395 | 3 | | | | | | 1.4 | 9 |
| | Phenolic compound | MEH-8000H | 17.4 | 18.9 | 15.4 | 18.9 | 19.4 | 16.9 | 16.9 | 10 |
| | | MEH-8005 | | | | | | | | |
| | | ELPC75 | | | | | | | | |
| | | ELP83H | | | | | | | | |
| | | Diallyl bisphenol A | | | | | | | | |
| | Thixo agent | Gelol D | 2.3 | | | 2.3 | 2.3 | 2.3 | 3 | 2 |
| | | Gelol MD | | 0.5 | 5.5 | | | | | |
| | | Bisamide LA | | | | | | | | |
| | Solvent | DEDG | 2 | 2 | 2 | 1.7 | 1.7 | 1.7 | 4 | 1 |
| | | HEDG | | | | | | | | |
| Evaluation | Viscosity (Pa·s) | Type E viscometer, 25° C., 2.5 rpm | 140 | 95 | 170 | 90 | 88 | 94 | 85 | 82 |
| | Thixo ratio (0.25 rpm/2.5 rpm) | Type E viscometer, 25° C. | 2.6 | 1.5 | 9 | 3.0 | 2.8 | 3.3 | 3.6 | 3.5 |
| | Printability | Ni—Pd—Au pad substrate | C | C | C | A | A | A | A | A |
| | Tg (° C.) | TMA | A | A | A | A | C | A | A | B |
| | Wet spreadability | on copper plate | C | C | C | C | A | C | C | B |
| | Life | Viscosity increase rate | A | A | A | B | A | B | A | C |
| | Coverage rate | Ratio of cured product's height to bump height | A | A | A | A | A | A | A | A |
| Total evaluation | | | C | C | C | C | C | C | C | C |

First to eleventh examples may increase the coverage rate compared to a first comparative example containing no phenolic compound and a second comparative example containing no phenol novolac.

The first to third examples are each superior in terms of glass transition temperature to third and fourth comparative examples. Thus, the flux resin composition (X) preferably contains the epoxy resin (A1) falling within a predetermined range.

The fourth and fifth examples each contain the phenolic compound (E) falling within a predetermined range, and therefore, achieve a sufficient coverage rate.

The sixth and seventh examples are each superior in terms of printability and wet spreadability to tenth and eleventh comparative examples. Thus, the flux resin composition (X) preferably contains the activator (D) falling within a predetermined range.

The eighth and ninth examples are each superior in terms of wet spreadability to fifth and sixth comparative examples. Thus, the flux resin composition (X) preferably contains the thixo agent (C) falling within a predetermined range.

The tenth and eleventh examples are each superior in terms of printability and wet spreadability to seventh to ninth comparative examples. Thus, the flux resin composition (X) preferably contains the imidazole compound (B) falling within a predetermined range.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A flux resin composition containing:
   60% by weight to 80% by weight of an epoxy resin;
   0.01% by weight to 2% by weight of an imidazole compound;
   1% by weight to 5% by weight of a thixo agent;
   4% by weight to 20% by weight of an activator; and
   7% by weight to 30% by weight of a phenolic compound,
   the epoxy resin containing at least one resin selected from the group consisting of naphthalene type epoxy resins, biphenyl aralkyl type epoxy resins, trisphenol methane type epoxy resins, biphenyl type epoxy resins, and dicyclopentadiene type epoxy resins, content of the at least one resin falling within a range from 15% by weight to 40% by weight with respect to a total weight of the flux resin composition,
   the phenolic compound being liquid and containing a phenol novolac;
   wherein a coverage rate of the flux composition being at least 10% when tested according to the follow test procedure:
      a bump with a diameter of 300 μm formed on a substrate having n Ni—Pd—Au pad with @ of 300 μm and 0.5 mmP, and a reflow process carried out according to the reflow profile of FIG. 1, wherein the dashed curve indicates the heating temperature, the solid curve indicates the viscosity of the flux resin composition (X), T3 (° C.) is a melting point of the bump, and T1 (C) and T2 (° C.) are particular temperatures that meet the relation:
      room temperature $<T1<T2<T3$;
   wherein coverage rate is equal to $(HR/HB) \times 100$ (%), where HR is the height of a reinforcing portion and HB is the height of the bump.

2. The flux resin composition of claim 1, wherein
   the flux resin composition has a viscosity at 25° C. and 2.5 rpm falling within a range from 10 Pa·s to 250 Pa·s and a thixo ratio at 25° C. and 0.25 rpm/2.5 rpm falling within a range from 1.5 to 8.

3. The flux resin composition of claim 1, wherein
   a cured product of the flux resin composition has a glass transition temperature Tg equal to or higher than 85° C.

4. The flux resin composition of claim 2, wherein
   a time it takes for a value calculated by (viscosity of the flux resin composition after storage/ viscosity of the flux resin composition at beginning of the storage)×100 (%)

to reach 120% since the flux resin composition has started to be stored at 25° C. is equal to or longer than 24 hours.

5. The flux resin composition of claim 2, wherein the imidazole compound has a melting point equal to or higher than 130° C.

6. An electronic component comprising:
   an electronic component body;
   a conductor formed on a surface of the electronic component body;
   a solder bump disposed on the conductor and electrically connected to the conductor; and
   a reinforcing portion that is a cured product of the flux resin composition according to claim 2 and covers a joint between the conductor and the solder bump.

7. A method for manufacturing the mounting structure of claim 6, the method comprising
   curing the flux resin composition after applying the flux resin composition onto the joint between the second conductor and the solder bump.

8. A mounting structure comprising:
   a circuit board including a first conductor;
   an electronic component including a second conductor;
   a solder bump interposed between the first conductor and the second conductor and electrically connecting the first conductor and the second conductor to each other; and
   a reinforcing portion that is a cured product of the flux resin composition according to claim 2 and reinforces at least one of a joint between the first conductor and the solder bump or a joint between the second conductor and the solder bump.

9. A method for manufacturing the mounting structure of claim 8, the method comprising
   curing the flux resin composition after applying the flux resin composition onto at least one of the joint between the first conductor and the solder bump or the joint between the second conductor and the solder bump.

10. The flux resin composition of claim 2, wherein a cured product of the flux resin composition has a glass transition temperature Tg equal to or higher than 85° C.

11. The flux resin composition of claim 2, wherein
    a time it takes for a value calculated by (viscosity of the flux resin composition after storage/ viscosity of the flux resin composition at beginning of the storage)×100 (%)

to reach 120% since the flux resin composition has started to be stored at 25° C. is equal to or longer than 24 hours.

12. The flux resin composition of claim 10, wherein the imidazole compound has a melting point equal to or higher than 130° C.

13. An electronic component comprising:
    an electronic component body;
    a conductor formed on a surface of the electronic component body;
    a solder bump disposed on the conductor and electrically connected to the conductor; and a reinforcing portion that is a cured product of the flux resin composition according to claim 3 and covers a joint between the conductor and the solder bump.

14. The flux resin composition of claim 1, wherein
    a time it takes for a value calculated by (viscosity of the flux resin composition after storage/ viscosity of the flux resin composition at beginning of the storage)×100 (%)

to reach 120% since the flux resin composition has started to be stored at 25° C. is equal to or longer than 24 hours.

15. The flux resin composition of claim 1, wherein the imidazole compound has a melting point equal to or higher than 130° C.

16. An electronic component comprising:
    an electronic component body;
    a conductor formed on a surface of the electronic component body;
    a solder bump disposed on the conductor and electrically connected to the conductor; and
    a reinforcing portion that is a cured product of the flux resin composition according to claim 2 and covers a joint between the conductor and the solder bump.

17. A method for manufacturing the electronic component of claim 16, the method comprising curing the flux resin composition after applying the flux resin composition onto the joint between the conductor and the solder bump.

18. A mounting structure comprising:

a circuit board including a first conductor;

an electronic component including a second conductor;

a solder bump interposed between the first conductor and the second conductor and electrically connecting the first conductor and the second conductor to each other; and a reinforcing portion that is a cured product of the flux resin composition according to claim 1 and reinforces at least one of a joint between the first conductor and the solder bump or a joint between the second conductor and the solder bump.

19. A method for manufacturing the mounting structure of claim 8, the method comprising curing the flux resin composition after applying the flux resin composition onto at least one of the joint between the first conductor and the solder bump or the joint between the second conductor and the solder bump.

\* \* \* \* \*